(12) United States Patent
Sugai et al.

(10) Patent No.: US 12,224,390 B2
(45) Date of Patent: Feb. 11, 2025

(54) ELECTRONIC COMPONENT MOUNTING SUBSTRATE AND ELECTRONIC DEVICE

(71) Applicant: KYOCERA Corporation, Kyoto (JP)

(72) Inventors: Kouichirou Sugai, Kyoto (JP); Kazuki Nishimoto, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 194 days.

(21) Appl. No.: 17/914,031

(22) PCT Filed: Mar. 23, 2021

(86) PCT No.: PCT/JP2021/011931
§ 371 (c)(1),
(2) Date: Sep. 23, 2022

(87) PCT Pub. No.: WO2021/193607
PCT Pub. Date: Sep. 30, 2021

(65) Prior Publication Data
US 2023/0123973 A1    Apr. 20, 2023

(30) Foreign Application Priority Data
Mar. 27, 2020   (JP) .................................. 2020-058032

(51) Int. Cl.
| | | |
|---|---|---|
| H01L 33/00 | (2010.01) | |
| H01L 31/024 | (2014.01) | |
| H01L 33/64 | (2010.01) | |
| H01S 5/02315 | (2021.01) | |
| H01S 5/024 | (2006.01) | |

(52) U.S. Cl.
CPC .......... *H01L 33/644* (2013.01); *H01L 31/024* (2013.01); *H01S 5/02315* (2021.01); *H01S 5/02469* (2013.01)

(58) Field of Classification Search
CPC ....... H01L 2924/00; H01L 2224/45124; H01L 2224/48137; H01L 25/167; H01L 33/64; H01L 33/486; H01L 2224/024; H01L 2224/73265; H05K 2201/10106; H05K 1/056; H05K 1/0203; H05K 3/0061; H05K 1/053; H05K 1/181
See application file for complete search history.

(56) References Cited

U.S. PATENT DOCUMENTS

| | | | | |
|---|---|---|---|---|
| 2014/0226290 | A1* | 8/2014 | Hayashi | H01L 24/19 |
| | | | | 174/250 |
| 2015/0060920 | A1* | 3/2015 | Horikawa | H05K 1/188 |
| | | | | 361/761 |
| 2017/0338189 | A1* | 11/2017 | Soda | H01L 23/3672 |
| 2020/0183056 | A1* | 6/2020 | Nikitin | G02B 1/118 |

FOREIGN PATENT DOCUMENTS

| | | |
|---|---|---|
| JP | 08-008372 A | 1/1996 |
| JP | 2014-096461 A | 5/2014 |
| WO | 2017/188237 A1 | 11/2017 |

\* cited by examiner

*Primary Examiner* — Mandeep S Buttar
(74) *Attorney, Agent, or Firm* — Volpe Koenig

(57) ABSTRACT

An electronic component mounting substrate includes: a metal substrate including a first surface, an insulation substrate including a second surface on which a first metal layer having a frame shape is provided, and a bonding material that bonds the first surface and the first metal layer. The bonding material is located in a region that includes the first metal layer and that is surrounded by the first metal layer in a plane perspective.

6 Claims, 13 Drawing Sheets

ELECTRONIC COMPONENT MOUNTING SUBSTRATE AND ELECTRONIC DEVICE

TECHNICAL FIELD

The present disclosure relates to an electronic component mounting substrate and an electronic device.

BACKGROUND ART

In recent years, electronic devices such as LEDs and LDs used in automobile headlamps or the like are required to have high heat dissipating properties. For example, an electronic component mounting substrate having a metal substrate and an insulation substrate is used for such an electronic device (e.g., see WO 2017/188237).

SUMMARY OF INVENTION

An electronic component mounting substrate according to the present disclosure includes: a metal substrate including a first surface; an insulation substrate including a second surface on which a first metal layer having a frame shape is provided; and a bonding material that bonds the first surface and the first metal layer. The bonding material is located in a region that includes the first metal layer and that is surrounded by the first metal layer in a plane perspective.

An electronic device according to the present disclosure includes the electronic component mounting substrate described above and an electronic component mounted on the electronic component mounting substrate.

DESCRIPTION OF EMBODIMENTS

Figure 1A:
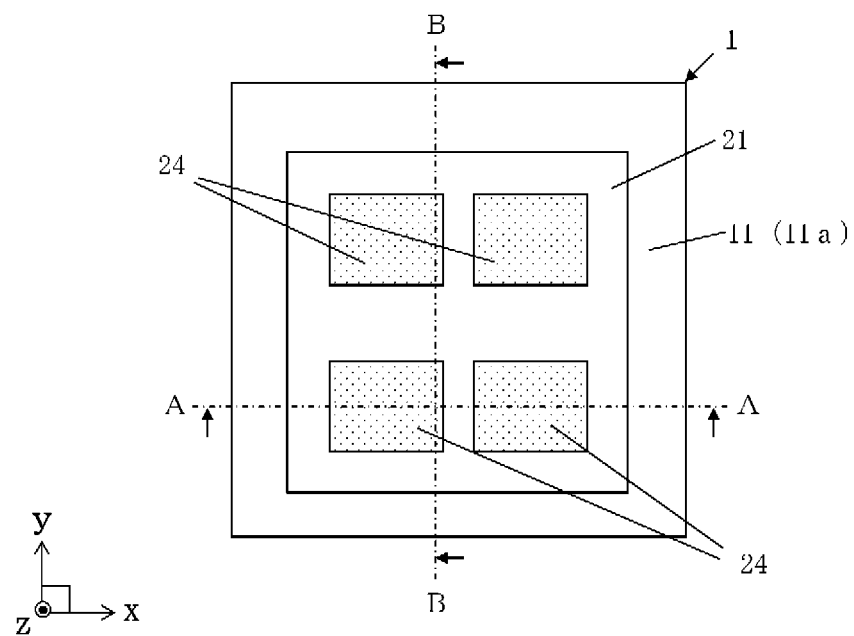
FIG. 1A is a top view illustrating an electronic component mounting substrate according to a first embodiment.
Figure 1B:
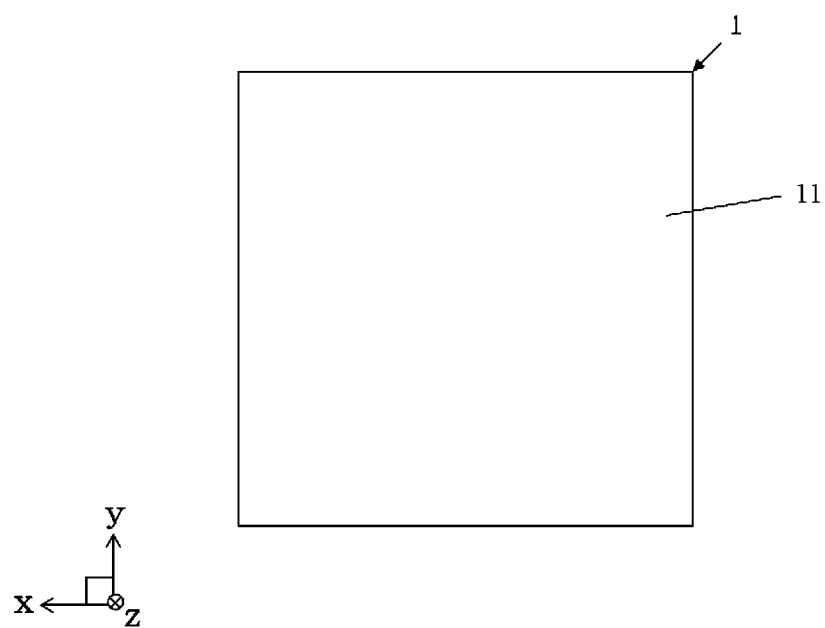
FIG. 1B is a bottom view of FIG. 1A.

Some exemplary embodiments of the present disclosure will be described with reference to the accompanying drawings.

First Embodiment

An electronic component mounting substrate 1 according to the present embodiment includes: a metal substrate 11 having a first surface 11a; an insulation substrate 21 having a second surface 21a on which a first metal layer 22 having a frame shape is provided; and a bonding material 31 that bonds the first surface 11a and the first metal layer 22. The bonding material 31 is located in a region that includes the first metal layer 22 and is surrounded by the first metal layer 22 in a plane perspective. In the plane perspective, the second metal layer 23 is located in a region surrounded by the first metal layer 22 of the second surface 21a. A wiring layer 24 is located on a surface of the insulation substrate 21, opposite to the second surface 21a. In FIGS. 1A to 5, the upward direction refers to the positive direction of an imaginary z-axis. It should be noted that the distinction between upper and lower in the following description is for convenience only and is not intended to limit the upper and lower directions when the electronic component mounting substrate 1 or the like is actually used.

The metal substrate 11 includes the first surface 11a (upper surface in FIGS. 1A to 5), a third surface (lower surface in FIGS. 1A to 5) opposite to the first surface 11a in the thickness direction, and side surfaces. As the metal substrate 11, a material having high thermal conductivity, for example, a metal material such as copper (Cu), copper-tungsten (Cu—W), or aluminum (Al) can be used. When the electronic component mounting substrate 1 is applied to a headlamp or the like of an automobile, aluminum may be used as the metal substrate 11 in view of its light weight.

The insulation substrate 21 includes the second surface 21a (lower surface in FIGS. 1A to 5), a fourth surface (upper surface in FIGS. 1A to 5) opposite to the second surface 21a in the thickness direction, and side surfaces. The insulation substrate 21 is composed of a single insulation layer or a plurality of insulation layers, and has a square shape in plan view, that is, when viewed from a direction perpendicular to the second surface 21a. The first surface 11a of the metal substrate 11 and the second surface 21a of the insulation substrate 21 are located opposite to each other. The insulation substrate 21 functions as a support for supporting an electronic component 2. The insulation substrate 21 includes the wiring layer 24 for mounting the electronic component 2 on the side of the fourth surface in plan view, and the first metal layer 22 and the second metal layer 23 for joining with the metal substrate 11 on the side of the second surface 21a in plan view.

As the insulation substrate 21, for example, a ceramic such as an aluminum oxide sintered body (alumina ceramic), an aluminum nitride sintered body, a silicon nitride sintered body, a mullite sintered body or a glass ceramic sintered body can be used. As the insulation substrate 21, for example, a ceramic such as an aluminum oxide sintered body (alumina ceramic), an aluminum nitride sintered body, a silicon nitride sintered body, a mullite sintered body or a glass ceramic sintered body can be used. When the insulation substrate 21 is, for example, an aluminum nitride sintered body, a slurry is prepared by adding and mixing a suitable organic binder and a solvent to raw material powders such as aluminum nitride (AlN), erbium oxide ($Er_2O_3$), and yttrium oxide ($Y_2O_3$). A ceramic green sheet is produced by molding the slurry into a sheet by employing a conventionally known doctor blade method, calender roll method, or the like. As required, a plurality of ceramic green sheets are laminated and fired at a high temperature (about 1800° C.) to produce the insulation substrate 21 consisting of a single insulation layer or a plurality of insulation layers. To achieve the electronic component mounting substrate 1 having excellent heat dissipating properties, an aluminum nitride sintered body or a silicon nitride sintered body may be used for the insulation substrate 21.

The first metal layer 22 is located on the second surface 21a of the insulation substrate 21. The second metal layer 23 is located on the second surface 21a of the insulation substrate 21. The first metal layer 22 and the second metal layer 23 are used as bonding portions of the bonding material 31 or the like to bond the metal substrate 11 and the insulation substrate 21.

The wiring layer 24 is located on the fourth surface of the insulation substrate 21. The wiring layer 24 is used as a connecting portion of a connecting member 3 such as a bonding wire, and is used for electrically connecting the electronic component 2 to connection pads of a module substrate.

The first metal layer 22, the second metal layer 23, and the wiring layer 24 each include a thin film layer and a plating layer. The thin film layer includes, for example, an adhesion metal layer and a barrier layer. The adhesion metal layer constituting the thin film layer is formed on the second surface 21a or the fourth surface of the insulation substrate 21. The adhesion metal layer is made of, for example, tantalum nitride, nickel-chromium, nickel-chromium-silicon, tungsten-silicon, molybdenum-silicon, tungsten, molybdenum, titanium, or chromium, and is deposited on the second surface 21a or the fourth surface of the insulation substrate 21 by employing a thin film forming technique such as a vapor deposition method, an ion plating method, or a sputtering method. For example, in the case of forming the adhesion metal layer by the vacuum deposition method, the insulation substrate 21 is set in the deposition chamber of the vacuum deposition apparatus, and a metal piece to be the adhesion metal layer is disposed at the deposition source in the deposition chamber. Thereafter, the deposition chamber is brought into a vacuum state (pressure of $10^{-2}$ Pa or less), the metal piece disposed at the deposition source is heated and deposited, and molecules of the deposited metal piece are deposited on the insulation substrate 21 to form a thin film metal layer to be the adhesion metal layer. After a resist pattern is formed by photolithography on the insulation substrate 21 on which the thin film metal layer has been formed, the excess thin film metal layer is removed by etching to form the adhesion metal layer. A barrier layer is deposited on the upper surface of the adhesion metal layer. The barrier layer has good wettability and bonding properties with the adhesion metal layer and the plating layer and serves to firmly bond the adhesion metal layer and the plating layer and to make the adhesion metal layer and the plating layer less likely to interdiffuse. The barrier layer is composed of, for example, nickel-chromium, platinum, palladium, nickel, or cobalt, and is deposited on the surface of the adhesion metal layer by a thin film forming technique such as a vapor deposition method, an ion plating method, or a sputtering method.

The thickness of the adhesion metal layer is preferably about from 0.01 to 0.5 μm. When the thickness is less than 0.01 μm, it tends to be difficult to firmly adhere the adhesion metal layer on the insulation substrate 21. When the thickness exceeds 0.5 μm, the adhesion metal layer is more likely to peel off due to internal stress at the time of forming the adhesion metal layer. The thickness of the barrier layer is preferably about from 0.05 to 1 μm. When the thickness is less than 0.05 μm, defects such as pinholes are generated, and the barrier layer is less likely to function as intended. When the thickness exceeds 1 μm, the barrier layer is more likely to peel off due to internal stress at the time of forming the barrier layer.

The plating layer is deposited on an exposed surface of the thin film layer by an electroplating method or an electroless plating method. The plating layer is made of a metal such as nickel, copper, gold or silver which has excellent corrosion resistance and excellent connection performance with the connecting member 3. For example, a nickel plating layer having a thickness of about from 0.5 to 5 μm and a gold plating layer having a thickness of about from 0.1 to 3 μm are sequentially deposited. Thus, the first metal layer 22, the second metal layer 23, and the wiring layer 24 can be effectively prevented from corroding, and the bonding between the wiring layer 24 and the connecting member 3 and the bonding between the first metal layer 22, the second metal layer 23 and the metal substrate 11 can be strengthened.

Further, a metal layer such as copper (Cu) or gold (Au) may be arranged on the barrier layer so that the plating layer is satisfactorily formed. The metal layer is formed by the same method as the thin film layer.

Between the metal substrate 11 and the insulation substrate 21, the first surface 11a of the metal substrate 11 and the first metal layer 22 and the second metal layer 23 located on the second surface 21a of the insulation substrate 21 are bonded by the bonding material 31. The bonding material 31 is located in a region surrounded by the first metal layer 22 in a plane perspective. The outer edge (outer surface) of the bonding material 31 has a meniscus shape. The bonding material 31 is bonded to the entire region of the first surface 11a of the metal substrate 11 in a plane perspective in the region surrounded by the first metal layer 22. In the region surrounded by the first metal layer 22, the bonding material 31 is not bonded to the second surface 21a of the insulation substrate 21, except for the first metal layer 22 and the second metal layer 23 in a plane perspective. The bonding material 31 may be located from the region surrounded by the first metal layer 22 to the outside of the region surrounded by the first metal layer 22 in a plane perspective. In the above case, the bonding material 31 may be located inward of the outer edge of the insulation substrate 21 in a plane perspective.

An electronic device can be manufactured by mounting the electronic component 2 on the fourth surface of the insulation substrate 21 of the electronic component mounting substrate 1. The electronic component 2 mounted on the electronic component mounting substrate 1 is a light emitting element such as a laser diode (LD) or a light-emitting diode (LED), or a light receiving element such as a photo diode (PD). For example, when the electronic component 2 is a wire-bonding type light emitting element, the light emitting element is fixed on the insulation substrate 21 by a bonding member such as a low-melting point brazing material or an electrically conductive resin, and then is mounted on the electronic component mounting substrate 1 by electrically connecting an electrode of the light emitting element and the wiring layer 24 via a connecting member 3 such as a bonding wire. Thus, the electronic component 2 is electrically connected to the wiring layer 24.

For example, when the electronic component 2 is a flip-chip type electronic component 2, the electronic component 2 is mounted on the electronic component mounting substrate 1 by electrically and mechanically connecting an electrode of the electronic component 2 and the wiring layer 24 via a connecting member 3 such as a solder bump, a gold bump or a conductive resin (anisotropic conductive resin or the like).

A plurality of the electronic components 2 may be mounted on the fourth surface of the electronic component mounting substrate 1 and, as required, a small electronic component such as a resistive element or a capacitive element, or other components, may be mounted around the electronic component 2. When a plurality of the electronic components 2 are mounted on the fourth surface of the electronic component mounting substrate 1, the region surrounding the plurality of electronic components 2 in plan view may be regarded as a mounting portion 11a. The electronic component 2 is encapsulated with an encapsulation member made of resin, glass or the like, or with a lid made of resin, glass, ceramic, metal or the like, as required. As in the example illustrated in FIG. 5, a heat dissipation member 4 such as a heat sink may be mounted on the electronic device.

The electronic component mounting substrate 1 according to the present embodiment includes: a metal substrate 11 including a first surface 11a; an insulation substrate 21 including a second surface 21a on which a first metal layer 22 having a frame shape is provided; and a bonding material 31 that bonds the first surface 11a and the first metal layer 22, where the bonding material 31 is located in a region that includes the first metal layer 22 and that is surrounded by the first metal layer 22 in a plane perspective. According to the above configuration, since the bonding material 31 is located in the region surrounded by the first metal layer 22, even when there is a difference in thermal expansion between the metal substrate 11 and the insulation substrate 21, the bonding material located in the region surrounded by the first metal layer 22 distributes stress due to the difference in thermal expansion between the metal substrate 11 and the insulation substrate 21, so that strain on the entire electronic component mounting substrate 1 is reduced. As a result, the electronic component mounting substrate 1 can have excellent reliability.

Even when the insulation substrate 21 is a thin substrate having a thickness of 0.3 mm or less, since the bonding material is located below the electronic component 2 when the electronic component 2 is mounted on the fourth surface of the insulation substrate 21, deflection of the insulation substrate 21 can be reduced when mounting the electronic component 2, the electronic component 2 can be mounted satisfactorily, and the electronic component mounting substrate 1 can have excellent reliability.

Figure 2:
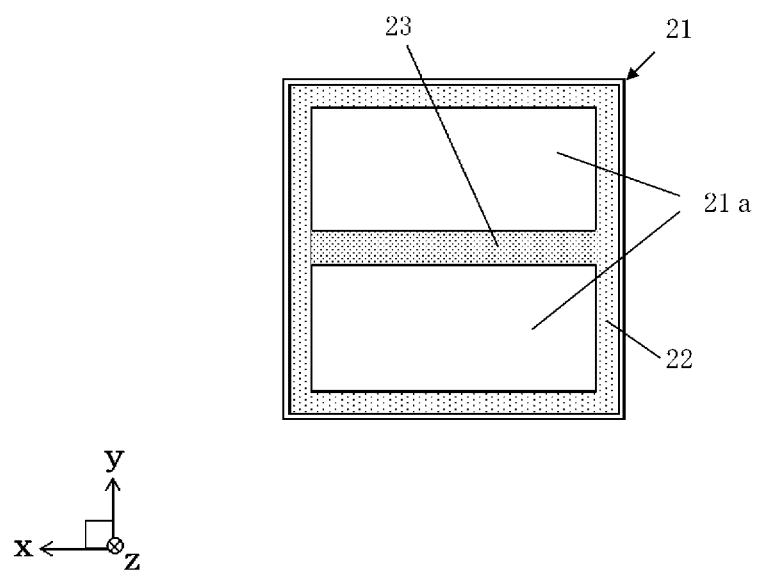
FIG. 2 is a bottom view of an insulation substrate in the electronic component mounting substrate illustrated in FIG. 1A.

As in the example illustrated in FIG. 2, the insulation substrate 21 includes a second metal layer 23 located inside the first metal layer 22 in a front view of the second surface 21a. According to the above configuration, even when a difference in thermal expansion occurs between the metal substrate 11 and the insulation substrate 21 while operating the electronic component 2, the compressive stress between the first metal layer 22 and the second metal layer 23 is distributed by the bonding material 31 located between the first metal layer 22 and the second metal layer 23 to reduce the stress applied to the insulation substrate 21, and reduce the strain of the insulation substrate 21. As a result, the electronic component mounting substrate 1 can have excellent reliability.

In a vertical cross-sectional view, the bonding material 31 has a height in the region surrounded by the first metal layer 22 equal to a height in a region bonding the first metal layer 22 or the second metal layer 23. With the above configuration, the compressive stress between the first metal layer 22 and the second metal layer 23 is well distributed by the bonding material 31 located between the first metal layer 22 and the second metal layer 23 to reduce the stress on the insulation substrate 21 and to further reduce the strain of the insulation substrate 21. As a result, the electronic component mounting substrate 1 can have excellent reliability.

Figure 3A:
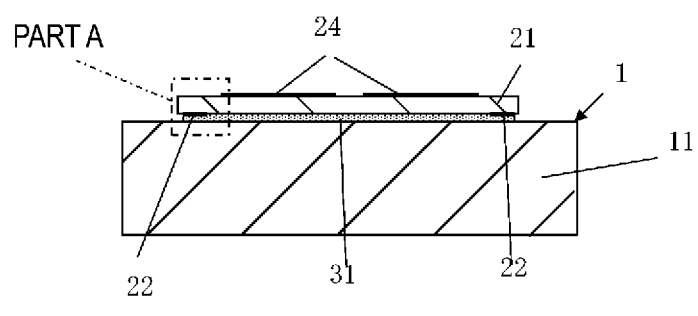
FIG. 3A is a vertical cross-sectional view taken along line A-A, of the electronic component mounting substrate illustrated in FIG. 1A.
Figure 3A:
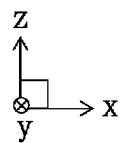
Figure 3B:
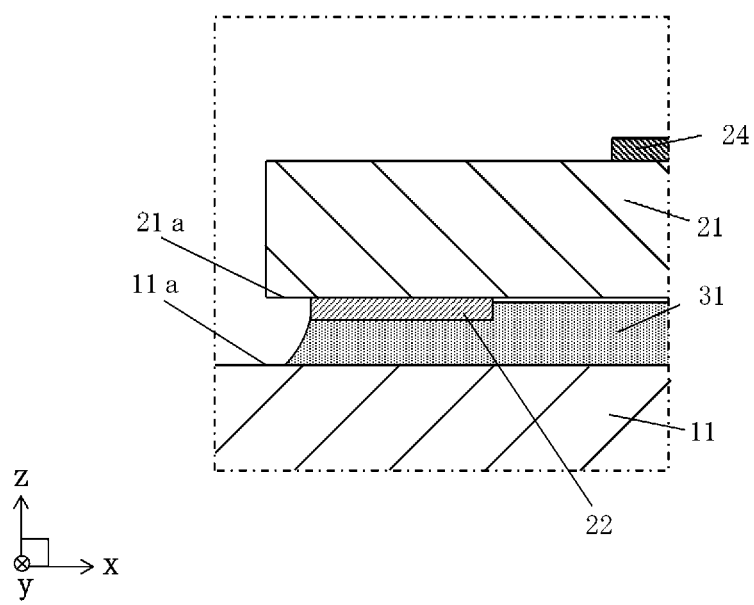
FIG. 3B is an enlarged vertical cross-sectional view of a main part being part A of FIG. 3A.
Figure 4A:
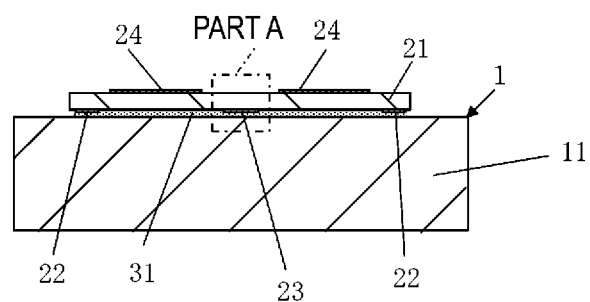
FIG. 4A is a vertical cross-sectional view taken along line B-B, of the electronic component mounting substrate illustrated in FIG. 1A.
Figure 4A:
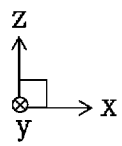
Figure 4B:
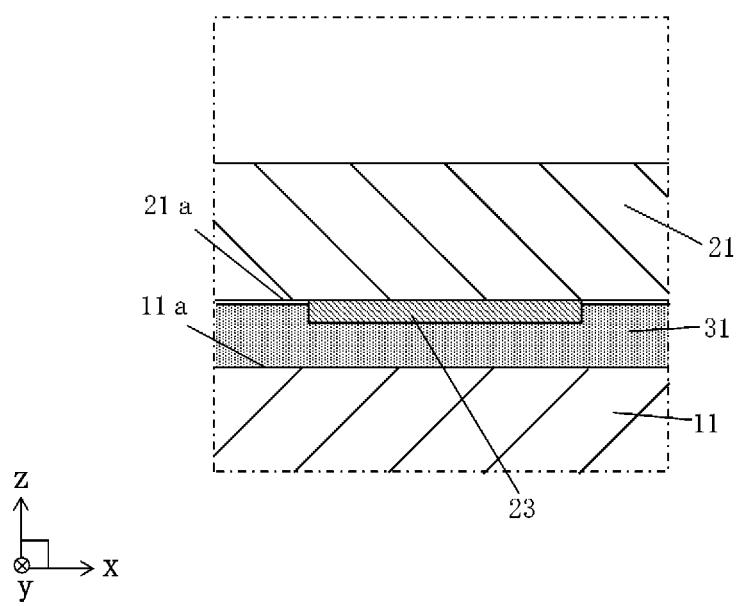
FIG. 4B is an enlarged vertical cross-sectional view of a main part being part A of FIG. 4A.

As in the example illustrated in FIGS. 3A and 3B, the bonding material 31 has a height in the region surrounded by the first metal layer 22 that is higher than a height in a region bonding the first metal layer 22 or the second metal layer 23 in a vertical cross-sectional view. That is, in the region surrounded by the first metal layer 22, the interval between the second surface 21a of the insulation substrate 21 and the bonding material 31 is smaller than the thickness of the first metal layer 22 or the thickness of the second metal layer 23. With the above configuration, the compressive stress between the first metal layer 22 and the second metal layer 23 is well distributed by the bonding material 31 located between the first metal layer 22 and the second metal layer 23 to reduce the stress on the insulation substrate 21 and further reduce the strain of the insulation substrate 21. As a result, the electronic component mounting substrate 1 can have excellent reliability.

The second metal layer 23 is connected to the first metal layer 22 in a front view, as in the example illustrated in FIG. 2. With the above configuration, the compressive stress between the first metal layer 22 and the second metal layer 23 in a direction orthogonal to the direction connected to the second metal layer 23 is well distributed by the bonding material 31 located between the first metal layer 22 and the second metal layer 23 to reduce the stress on the insulation substrate 21 and to further reduce the strain of the insulation substrate 21. As a result, the electronic component mounting substrate 1 can have excellent reliability.

In the above case, the second metal layer 23 is formed in a strip shape in the region surrounded by the first metal layer 22 and is connected to the first metal layer 22, as in the example illustrated in FIG. 2.

Figure 6A:
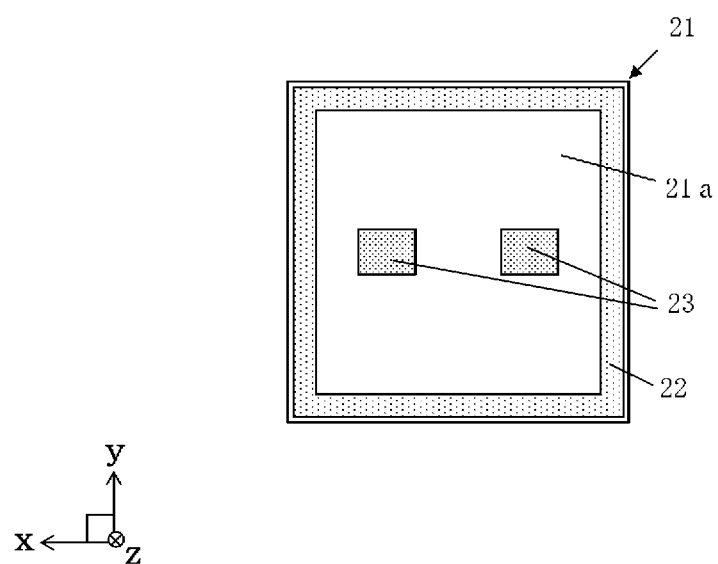
FIG. 6A is a bottom view illustrating another example of the insulation substrate in the electronic component mounting substrate illustrated in FIG. 1A.
Figure 6B:
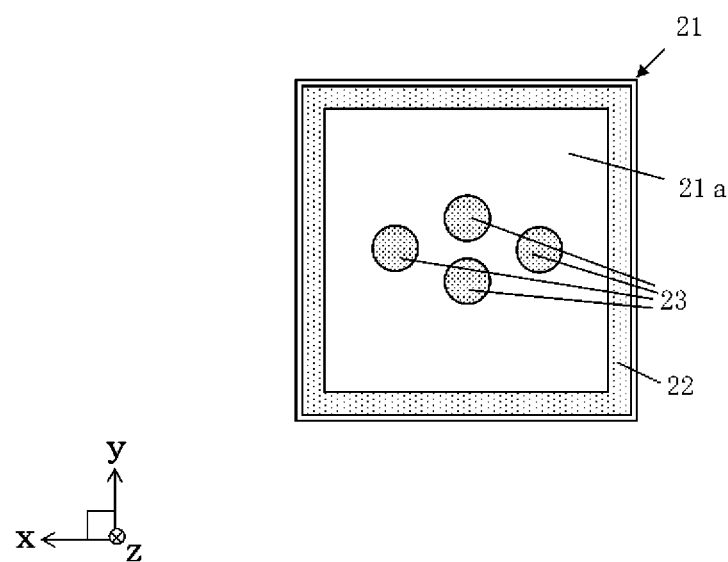
FIG. 6B is a bottom view illustrating another example of the insulation substrate in the electronic component mounting substrate illustrated in FIG. 1A.

The second metal layer 23 is separated from the first metal layer 22 in a front view, as in the example illustrated in FIGS. 6A and 6B. With the above configuration, the compressive stress between the first metal layer 22 and the second metal layer 23 is well distributed by the bonding material 31 located between the first metal layer 22 and the second metal layer 23 to reduce the stress on the insulation substrate 21 and to further reduce the strain of the insulation substrate 21. As a result, the electronic component mounting substrate 1 can have excellent reliability.

In the above case, the second metal layer 23 is formed as one or more metal layers in the region surrounded by the first metal layer 22, as in the example illustrated in FIGS. 6A and 6B. The second metal layer 23 is formed as a circular shape, or a polygonal shape having a quadrilateral shape in a plane perspective. When a plurality of metal layers are used for the second metal layer 23, the compressive stress between the respective second metal layers 23 is distributed by the bonding material 31 located between the respective second metal layers 23 to reduce the stress on the insulation substrate 21 and to further reduce the strain of the insulation substrate 21. As a result, the electronic component mounting substrate 1 can have excellent reliability.

When a light emitting element is used as the electronic component 2, the electronic component mounting substrate 1 can be an electronic component mounting substrate 1 for mounting a compact light emitting element of high brightness for a long period of time.

According to the electronic device of the present embodiment, since the electronic component mounting substrate 1 having the above configuration and the electronic component 2 mounted on the electronic component mounting substrate 1 are provided, the electronic device can be used satisfactorily over a long period of time.

The wiring layer 24 of the electronic device is electrically connected to a wiring conductor of an external device.

Figure 5:
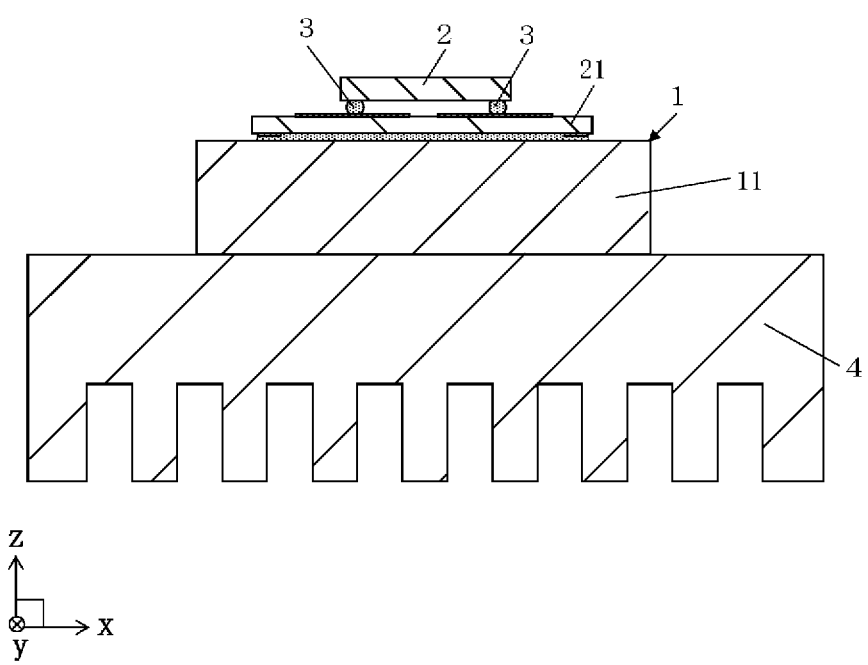
FIG. 5 is a vertical cross-sectional view illustrating an electronic device in which an electronic component is mounted on the electronic component mounting substrate of FIG. 1A and a heat dissipation member is mounted.

Further, as in the example illustrated in FIG. 5, the heat dissipation member 4 made of Al or the like is bonded to the lower surface of the electronic device. With the above configuration, the heat of the electronic device can be dissipated by the heat dissipation member 4 more satisfactorily, and the electronic device can be used satisfactorily over a long period of time.

In the heat dissipation member 4, for example, a through hole is formed outside the bonding portion between the electronic device and the heat dissipation member 4 in a plane perspective, the electronic device is held in an external device by screwing a screw inside the through hole, and the wiring layer of the electronic device and the wiring conductor of the external device are electrically connected by a connecting material.

Second Embodiment

Figure 7:
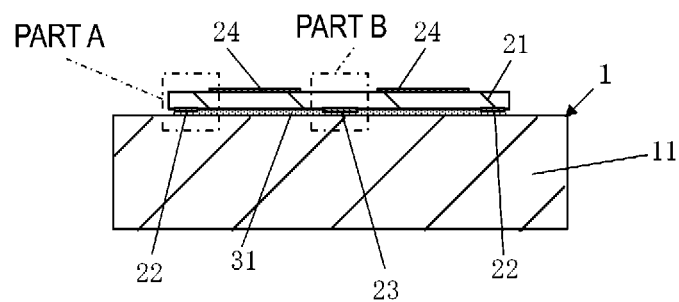
FIG. 7 is a vertical cross-sectional view of an electronic component mounting substrate according to a second embodiment.
Figure 7:
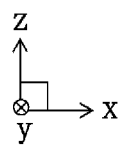
Figure 8A:
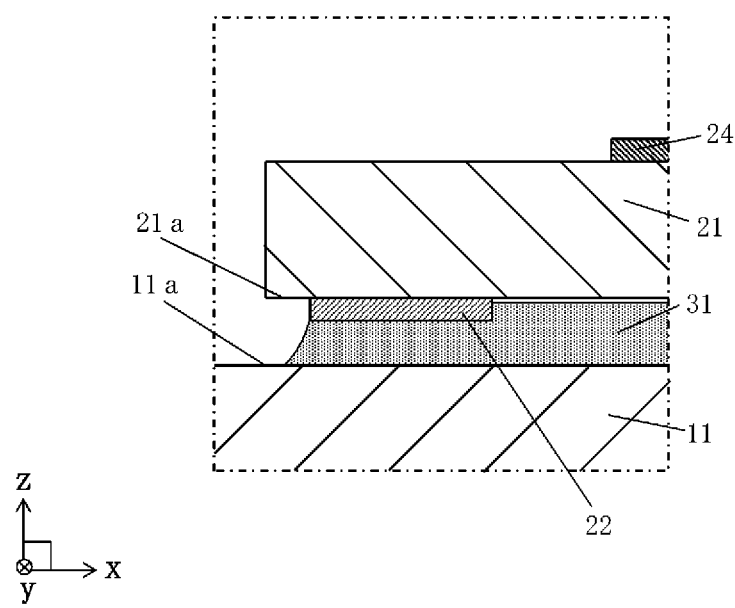
FIG. 8A is an enlarged vertical cross-sectional view of a main part being part A of FIG. 7.
Figure 8B:
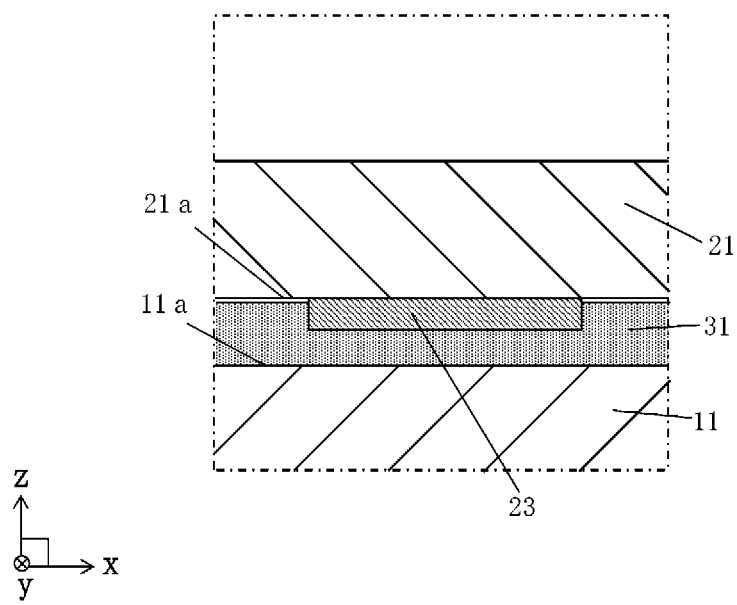
FIG. 8B is an enlarged vertical cross-sectional view of a main part being part B of FIG. 7.

Next, the electronic component mounting substrate 1 according to a second embodiment will be described with reference to FIGS. 7 to 8B.

The electronic component mounting substrate 1 according to the second embodiment differs from the electronic component mounting substrate 1 according to the above-described embodiment in that the first metal layer 22 and the second metal layer 23 located on the second surface 21a of the insulation substrate 21 have different thicknesses in a vertical cross-sectional view.

According to the electronic component mounting substrate 1 of the second embodiment, as in the case of the electronic component mounting substrate 1 of the above-described embodiment, since the bonding material 31 is located in the region surrounded by the first metal layer 22, even when there is a difference in thermal expansion between the metal substrate 11 and the insulation substrate 21, the bonding material located in the region surrounded by the first metal layer 22 distributes stress due to the difference in thermal expansion between the metal substrate 11 and the insulation substrate 21, so that the strain of the entire electronic component mounting substrate 1 is reduced and the electronic component mounting substrate 1 can have excellent reliability.

In the electronic component mounting substrate 1 according to the second embodiment, the second metal layer 23 may be, similar to that of the electronic component mounting substrate 1 according to the first embodiment, connected to the first metal layer 22 in a front view, or may be separated from the first metal layer 22 in a front view.

The electronic component mounting substrate 1 according to the second embodiment can otherwise be manufactured by the same manufacturing method as the electronic component mounting substrate 1 according to the above-described embodiment.

The present disclosure is not limited to the examples of the above-described embodiments, and various modifications can be made. For example, the insulation substrate 21 may have a rectangular shape having notches or chamfers on the side surfaces or corners in a plan view.

REFERENCE SIGNS LIST

1 Electronic component mounting substrate
11 Metal substrate
11a First surface
21 Insulation substrate
21a Second surface
22 First metal layer
23 Second metal layer
24 Wiring layer
31 Bonding material
2 Electronic component
3 Connecting member
4 Heat dissipation member

The invention claimed is:

1. An electronic component mounting substrate, comprising: a metal substrate comprising a first surface; an insulation substrate comprising a second surface having at least one metal layer having a thickness projecting therefrom that covers a portion of the second surface such that the second surface is divided into an area covered by the at least one metal layer and an area uncovered by any metal layer the at least one metal layer including a first metal layer having a frame shape disposed proximate a perimeter of the insulation substrate second surface and surrounding a portion of the uncovered area; and a layer of bonding material that bonds the first surface and the first metal layer that extends beneath the first metal layer and the area the first metal layer surrounds and that extends upwardly in the portion of the uncovered area that is surrounded by the frame shape less than the projecting thickness of the first metal layer whereby the bonding layer absorbs stress due to differential heat expansion characteristics between the metal substrate and the insulation substrate.

2. The electronic component mounting substrate according to claim 1, wherein
the insulation substrate comprises a second metal layer located inside the first metal layer in a front view of the second surface.

3. The electronic component mounting substrate according to claim 2, wherein
the second metal layer is separated from the first metal layer in the front view.

4. The electronic component mounting substrate according to claim 2, wherein
the second metal layer is connected to the first metal layer in the front view.

5. An electronic device, comprising:
the electronic component mounting substrate of claim 1; and
an electronic component mounted on the electronic component mounting substrate.

6. The electronic component mounting substrate according to claim 1, wherein the portion of the uncovered area surrounded by the first metal layer is substantially larger than the area covered by any metal layer.

* * * * *